United States Patent [19]

Ohba et al.

[11] Patent Number: 4,577,231
[45] Date of Patent: Mar. 18, 1986

[54] HIGH SENSITIVITY SOLID-STATE IMAGING DEVICE

[75] Inventors: Shinya Ohba, Kanagawa; Haruhisa Ando, Hachioji; Masaaki Nakai, Tokorozawa; Toshifumi Ozaki, Tokyo; Koichi Seki, Hachioji; Kenji Takahashi; Toshiyuki Akiyama, both of Kodaira; Iwao Takemoto, Tokyo; Takuya Imaide; Akihide Okuda, both of Yokohama; Masaharu Kubo, Hachioji, all of Japan

[73] Assignee: Hitachi, Ltd., Tokyo, Japan

[21] Appl. No.: 476,415

[22] Filed: Mar. 17, 1983

[30] Foreign Application Priority Data

Mar. 31, 1982 [JP] Japan ................................ 57-51215

[51] Int. Cl.⁴ .............................................. H04N 3/14
[52] U.S. Cl. ..................................... 358/212; 358/167
[58] Field of Search ............... 358/213, 212, 209, 167, 358/44, 48; 250/578

[56] References Cited

U.S. PATENT DOCUMENTS

| | | | |
|---|---|---|---|
| 4,301,471 | 11/1981 | Holscher | 358/105 |
| 4,307,423 | 12/1981 | Atherton | 358/213 |
| 4,335,406 | 6/1982 | Ohba et al. | 358/213 |
| 4,343,021 | 8/1982 | Frame | 358/213 |
| 4,349,743 | 9/1982 | Ohba et al. | 250/578 |
| 4,355,335 | 10/1982 | Imaide et al. | 358/213 |
| 4,363,035 | 12/1982 | Lehmann | 358/213 |
| 4,366,503 | 12/1982 | Terakawa et al. | 358/213 |
| 4,380,755 | 4/1983 | Enolicher | 382/68 |
| 4,407,010 | 9/1983 | Baji et al. | 358/213 |
| 4,443,818 | 4/1984 | Ohba et al. | 358/213 |
| 4,500,927 | 2/1985 | Ozawa | 358/293 |

OTHER PUBLICATIONS

Masuhara et al., "A Precise MOSFET Model for Low Voltage Circuits" IEEE Trans. on Electron Devices, vol. ED-21, No. 6, Jun. 1974.

Primary Examiner—Gene Z. Rubinson
Assistant Examiner—Robert G. Lev
Attorney, Agent, or Firm—Antonelli, Terry & Wands

[57] ABSTRACT

Disclosed is a two-dimensionally arrayed solid-state imaging device for a television camera having a photodiode array arranged at a photo-sensing section and a readout horizontal register constructed by a charge transfer device (CTD) such as a BCD, CCD or BBD. An inverter circuit is provided for each of the vertical signal lines. An input of the inverter circuit is connected to a vertical signal line drain of at least one transfer transistor arranged between the vertical signal line and the CTD, and an output of the inverter circuit is connected to a gate of the transfer transistor. Transfer efficiency is improved by the insertion of the inverter circuit and fixed pattern noise is substantially reduced by supplying bias currents.

8 Claims, 12 Drawing Figures

HIGH SENSITIVITY SOLID-STATE IMAGING DEVICE

BACKGROUND OF THE INVENTION

The present invention relates to a two-dimensionally arrayed solid-state imaging device having a photodiode array arranged at a photo-sensing section and a charge transfer device (CTD) such as a BCD, CCD or BBD as a readout horizontal register.

Figure 1:
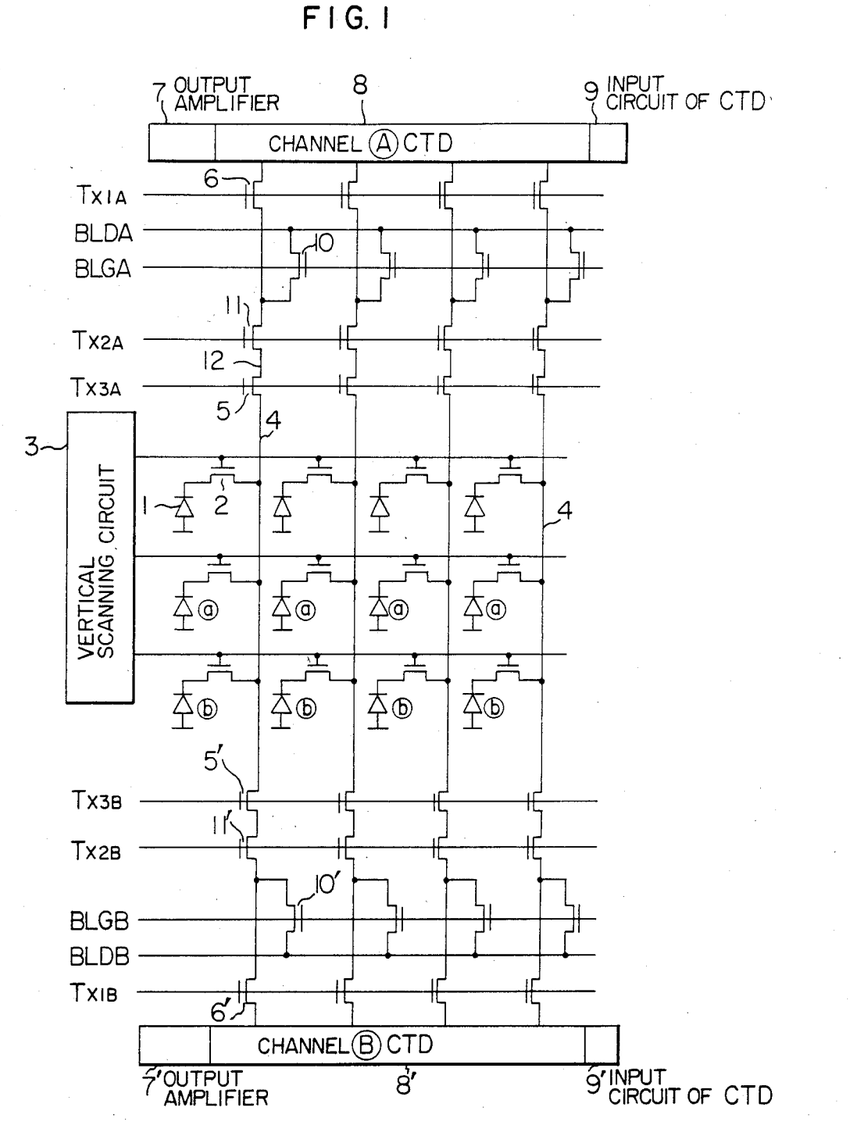
FIG. 1 shows an earlier imaging device developed for the same assignee as in the present case, and which corresponds to FIG. 5 of U.S. Ser. No. 462,763.

FIG. 1 shows an example of a photo-sensor having a diode array arranged at a photo-sensing section and a CTD as a readout register. FIG. 1 corresponds to FIG. 5 of U.S. Ser. No. 462,763, and, as noted in U.S. Ser. No. 462,763, represents earlier work unpublished as of the time of filing for the same assignee as in the present case. In FIG. 1, numeral 1 denotes photodiodes, numeral 2 denotes vertical switching MOS transistors (insulated gate type field effect transistors), numeral 3 denotes a vertical scanning circuit, numeral 4 denotes vertical signal lines, numerals 5 (5'), 11 (11') and 6 (6') denote gate MOS transistors, numeral 7 (7') denotes an output amplifier, numeral 8 (8') denotes a CTD which functions as a horizontal register, numeral 9 (9') denotes a CTD input circuit, and numeral 10 (10') denotes a blooming suppression circuit. The CTD 8 is usually driven in two phases, three phases or quasi-four phases. The CTD may be a BCD (bulk charge transfer device), a CCD (charge coupled device) or BBD (bucket brigade device). Quasi-signals such as blooming and vertical smear stored on the vertical signal lines 4 in a horizontal scanning period are swept out through the gates 5, 11 and 10 at a beginning of a horizontal blanking period. Thereafter, a horizontal line of picture cells shown by ⓐ in FIG. 1 are selected and one line of signals are transferred in a unit to the channel Ⓐ CTD register 8, and stored in respective memory areas.

The above operation is carried out in a first half of the horizontal blanking period, and in a second half period one horizontal line of signals of the photodiodes shown by ⓑ in FIG. 1 are transferred to and stored in the channel Ⓑ CTD register 8'. During the horizontal scanning period, the gates 6 and 6' are turned off and the CTD is driven to simultaneously read out the two lines of signals from the output amplifiers 7 and 7'. The two lines of signals are simultaneously read out in order to enhance a resolution of an image of a single-plate or substrate color sensor.

The imaging device of FIG. 1 has the following disadvantage. A transfer efficiency $\eta$ from the vertical signal line 4 to the horizontal register 8 is low and the transfer efficiency varies from line to line. As a result, a fixed pattern noise is produced. The transfer efficiency $\eta$ is represented by a product of a transfer efficiency $\eta_1$ from the vertical signal line 4 to a point 12 in FIG. 1 through the transistor 5 and a transfer efficiency $\eta_2$ from the point 12 to the CTD 8. The transfer efficiency $\eta_1$ through the transistor 5 is approximated by $$\eta_1 = \frac{t/T}{1 + t/T} \quad (1)$$

where t is a charge transfer time and T is defined by $$T = \frac{2 C_V^2}{q_o \cdot \beta} \quad (2)$$

where $\beta$ is a channel conductance of the transistor 5, $C_V$ is a capacitance per line of the vertical signal lines and $q_o$ is a transfer charge. In order to increase the transfer efficiency, the conductance $\beta$ of the transistor 5 may be increased or the capacitance $C_V$ of the vertical signal line 4 may be reduced. However, the capacitance $C_V$ of the vertical signal line is essentially determined by a manufacturing technique and it only has a small degree of freedom of design.

Figure 2:
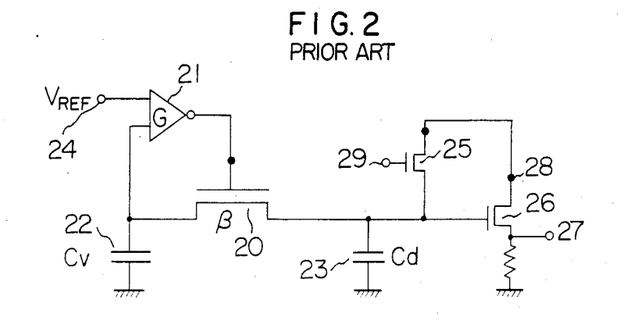
FIGS. 2, 3 and 4 show prior art circuits.

As an approach to increase the conductance of a transistor in order to increase the charge transfer efficiency, a method shown in FIG. 2 has been known. (See, for example, IEEE Vol. SC-12, No. 3, page 232 (1977), "J. Solid-State Circuits" by Jespers et al.) In the proposed circuit, a signal of a MOS-type imaging device is amplified by the circuit shown in FIG. 2 which is packaged on the same chip as the imaging device. (See FIG. 4) In FIG. 2, numeral 20 denotes a transfer transistor, numeral 21 denotes an inverter having a gain G, numerals 22 and 23 denote source and drain capacitances, numeral 24 denotes an inverter reference potential input terminal, numerals 25 and 29 denote a reset transistor and a gate thereof, numeral 26 denotes an output transistor, numeral 28 denotes a drain and numeral 27 denotes an output terminal. An effective conductance $\beta_{eff}$ of the transfer transistor 20 of the circuit of FIG. 2 is increased by the inverter 21 having the gain G as follows:

$$\beta_{eff} = (1+G)^2 \cdot \beta \quad (3)$$

Figure 3:
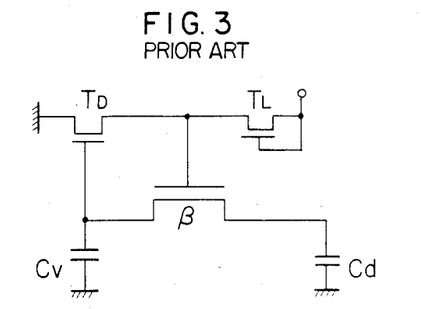

Accordingly, the charge transfer efficiency $\eta$ can be significantly increased. FIG. 3 shows a specific circuit therefor. However, the inventors of the present invention have found that the above circuit has problems with respect to a tailing characteristic of the transfer transistor and a random noise of the system.

SUMMARY OF THE INVENTION

It is an object of the present invention to provide a high sensitivity two-dimensionally arrayed imaging device which has a reduced fixed pattern noise by arranging inverter circuits between vertical signal lines and gates of transfer transistors.

In accordance with the present invention, in a solid-state imaging device which uses a CTD in a horizontal scanning circuit, the inverter circuits are provided one for each of the vertical signal lines, each being connected to the drain of the transfer transistor arranged between the vertical signal line and the CTD, and an output of each of the inverter circuits is connected to the gate of the transfer transistor.

DESCRIPTION OF THE PREFERRED EMBODIMENTS

Figure 5:
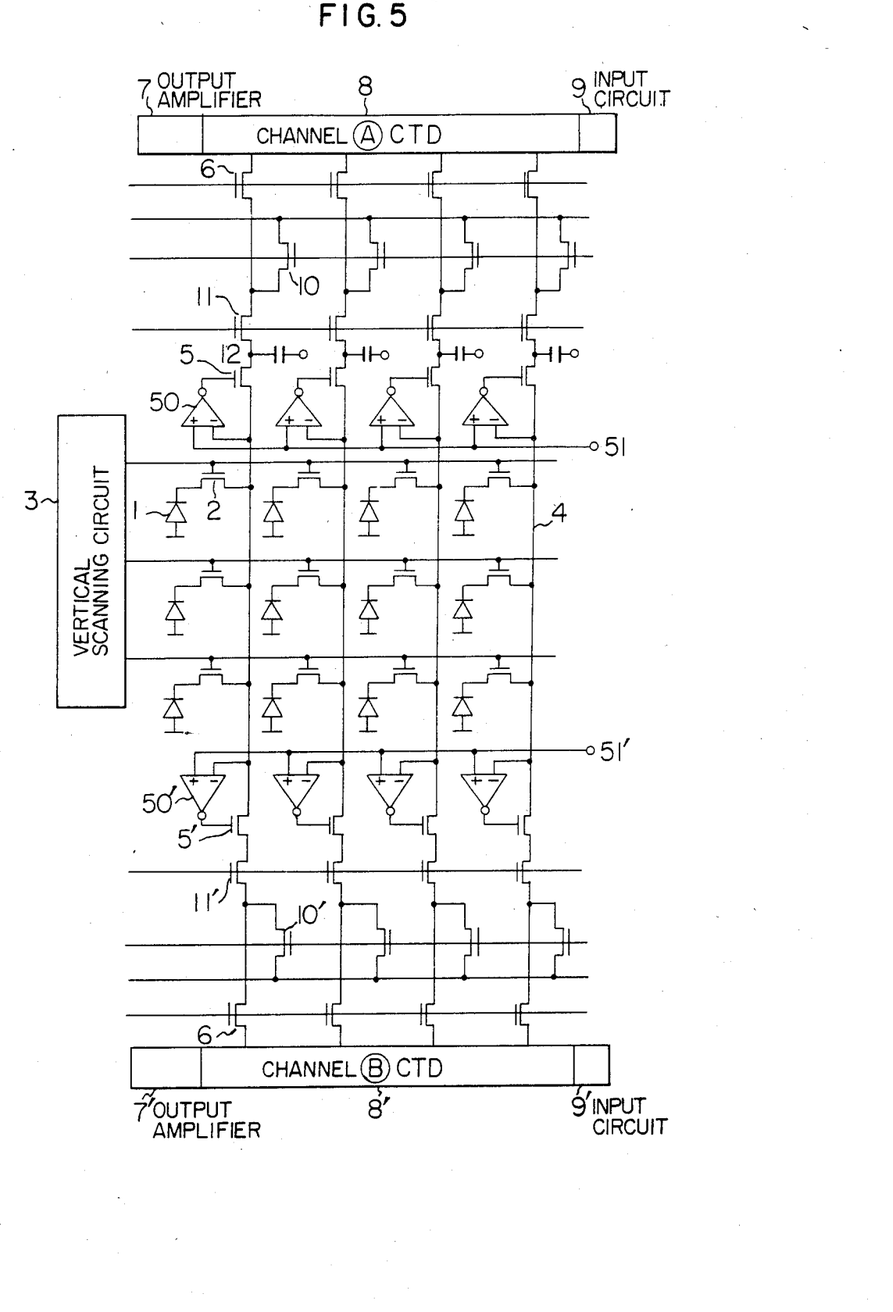
FIGS. 5, 6, 7, 9, 10, 11 and 12 show embodiments of the present invention.

Referring to FIG. 5, one embodiment of the present invention is now described. The numerals 1 to 11 are identical to those in FIG. 1. In the embodiment of FIG. 5, an inverter circuit 50 having one input terminal thereof connected to a corresponding one of the vertical signal lines 4 and the other input terminal connected to a common voltage line 51 is provided for each of the vertical signal lines 4. An output of the inverter circuit is connected to the gate of the corresponding transfer transistor. As described above in connection with FIG. 2, through the use of the inverter circuit having a gain G, the effective channel conductance $\beta_{eff}$ of the transfer transistor is represented by $$\beta_{eff} = (1+G)^2 \cdot \beta \qquad (4)$$

where $\beta$ is the conductance of the transfer transistor. Accordingly, a charge transfer loss $\epsilon_1$ from the vertical signal line 4 to the drain 12 through the transfer transistor is represented by $$\epsilon_1 = \frac{1}{1 + \frac{q_0 \cdot \beta_{eff}}{2 \cdot C_V^2} \cdot t} \approx \frac{2C_V^2}{q_0 \cdot \beta_{eff} \cdot t} \qquad (5)$$

$$\therefore \epsilon_1 = \frac{2C_V^2}{q_0 \cdot (1+G)^2 \cdot \beta \cdot t}$$

Thus, by the insertion of the inverter circuit, the charge transfer loss is reduced by a factor of $$1/(1+G)^2$$

Accordingly, a significant improvement of the transfer efficiency is attained.

In accordance with the present invention, a significant improvement of the characteristic is attained as described above. However, the present invention is not a mere combination of the circuit shown in FIG. 1 and the prior art circuit shown in FIG. 2, because the prior art circuits shown in FIGS. 2–4 and the present circuit shown in FIG. 5 are essentially different with respect to (1) the fixed pattern noise, (2) the random noise and (3) the tailing current. These will be discussed below.

Figure 4:
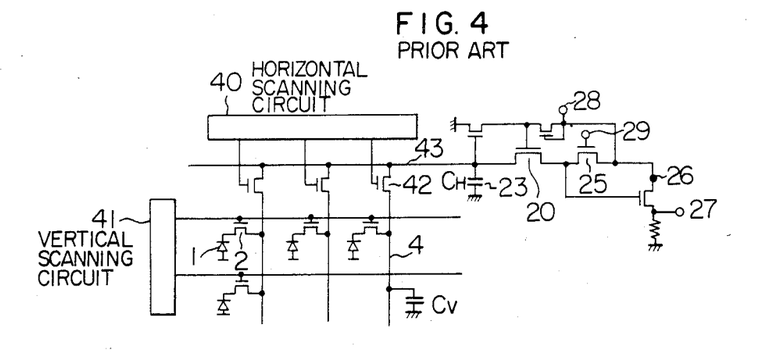

In the prior art circuit of FIG. 4, one transfer transistor 20 and one inverter circuit are provided for each of the horizontal output lines 43 of the MOS-type imaging device and the signals from the respective picture cells are outputted through the common transfer transistor. Accordingly, a random noise due to the switching of the horizontal switching transistor is mixed in the signal, but a fixed pattern noise due to a variation of characteristics of the inverter circuits is not produced.

On the other hand, in the present embodiment shown in FIG. 5, if characteristics such as offset voltages or gains G of the inverter circuits connected to the respective vertical signal lines vary, the conductances of the transfer transistors represented by the formula (4) vary. As a result, the quantities of charges read out of the respective vertical signal lines in a limited charge transfer time are different and a large fixed pattern noise is produced. Accordingly, the mere combination of the prior art circuits of FIGS. 1 and 2 does not improve the fixed pattern noise.

In the present embodiment shown in FIG. 5, in order to improve the fixed pattern noise due to the variation of the inverter circuits, the signals are read out after bias charges have been injected from the CTD 8 such as a BCD (bulk charge transfer device) to the vertical signal lines 4 through the transistors 6, or the signals are read out after bias charges stored in capacitors of the drains 12 of the transfer transistors have been injected to the vertical signal lines 4. Even if the reference potentials of the respective vertical signals are different from line to line, extra charges are not substantially generated if the reference potential at the time when the extra charges such as smear or blooming are discharged and the reference potential at the time when the signal is read are equal or have a very small difference therebetween for each vertical signal line, and as a result the fixed pattern noise is significantly reduced. Thus, the fixed pattern noise is not reduced by the mere combination of the two prior art circuits but the advantage of the present invention is attained by adding the bias charges.

The random noises in the prior art circuit of FIG. 4 and the present embodiment of FIG. 5 will now be discussed. While a detailed theory has not yet been established, a random noise current $i_{n1}$ in the prior art circuit of FIG. 4 is approximated by $$\overline{i_{n1}}^2 = 4kT \cdot f_{cp} \cdot B(C_V + C_H) \qquad (6)$$

where k represents a Boltzman constant, T an absolute temperature, $f_{cp}$ a drive frequency of the horizontal scanning circuit 40, B a signal band, $C_V$ a capacitance of the vertical signal line 4 and $C_H$ a capacitance 23 of the horizontal signal line 43. In general, $$C_H > C_V \qquad (7)$$

Assuming, for example, that $f_{cp} = 7$ MHz, $B = 3$ MHz, $C_V = 4$ pF and $C_H = 12$ pF, the noise current represented by the formula (6) is given by $$\overline{i_{n1}} \approx 1.6 \text{ nA} \qquad (8)$$

On the other hand, a noise current $i_{n2}$ of the present embodiment of FIG. 5 is represented by $$\overline{i_{n2}}^2 = 4kT \cdot C_V \cdot f_{cp} \cdot B + \overline{i_{nCCD}}^2 \qquad (9)$$

where k, T, $C_V$ and B are identical to those in the formula (6), $f_{cp}$ is a driven frequency of the charge transfer device 8 of the horizontal register, and $i_{nCCD}$ is a noise generated by the charge transfer device and it is usually very small, that is, less than 0.5 nA. Assuming, for example, that $C_V = 4$ pF and $i_{nCCD} = 0.2$ nA, $$\overline{i_{n2}} \approx 0.8 \text{ nA} \qquad (10)$$

Thus, $\overline{i_{n2}}$ is one half of $\overline{i_{n1}}$ of the formula (8) in the prior art circuit. It is thus apparent that the present embodiment of FIG. 5 is not the mere combination of the prior art circuits but the mechanism of generating the random noise is essentially different and the noise is reduced.

The difference between the tailing current (T. Masuhara et al, IEEE, T. Electron Devices, Vol. ED-21, No. 6, page 363, 1974) of the transfer transistor of the present embodiment of FIG. 5 and that of the prior arts of FIGS. 2–4 will now be discussed. In the prior art circuit of FIG. 4, even if a tailing current is present to some extent, only a signal level changes and no significant problem is raised. However, in the present embodiment of FIG. 5, if the tailing currents of the respective transfer transistors are different, the fixed pattern noise is produced. A gate voltage or a tailing coefficient $\alpha$ to vary the tailing current by one order is given by $$\alpha_{eff} = \alpha/(1+G)$$

because of the insertion of the inverter circuit having the gain G shown in FIG. 5. Thus, the tailing coefficient is reduced and the tailing current is also reduced. In the Jespers et al article cited above, it is described that the gain of the inverter circuit is preferably 3 and a problem will be raised when it is above 6. In the present embodiment, the fixed pattern noise can be reduced by selecting a larger gain to reduce the tailing current. The operation regions of the transfer transistor and the inverter circuit of the present embodiment of FIG. 5 are essentially different from those of the prior art of FIG. 4.

Figure 6:
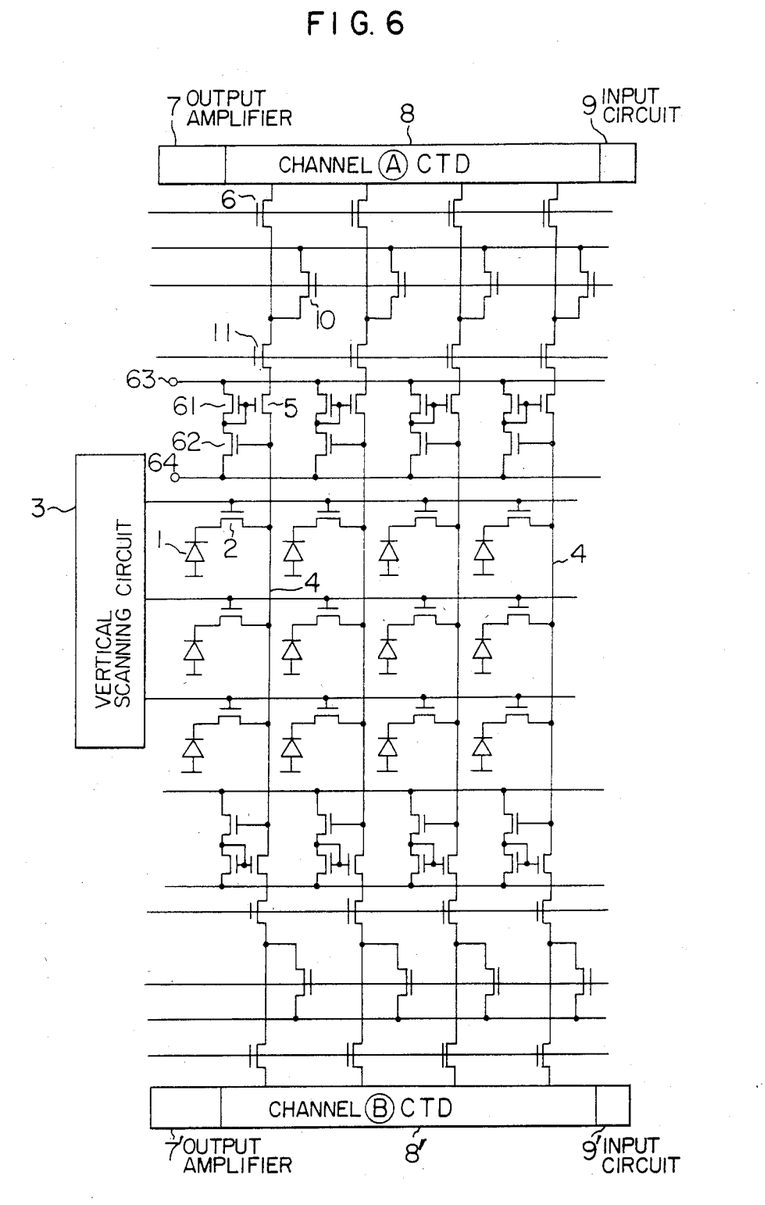

FIG. 6 shows another embodiment of the present invention. In the present embodiment, an inverter circuit includes a depletion type MOS transistor 61 as a load. Numeral 63 denotes a drain current of the inverter, numeral 64 denotes a source current, and numeral 62 denotes a driver MOS transistor. The depletion type load transistor 61 can be manufactured in the same step as the buried channel charge transfer device 8 and the number of photo-masks need not be increased. Since a power consumption in the inverter is reduced, at least one of the drain 63 and the source 64 may be pulse driven.

The voltages of the source 64 and the drain 63 must be selected such that the inverter is operated in a large gain region, and the source 64 is not necessarily grounded. Unlike the prior art by Jespers et al, the source is preferably biased in the present embodiment so that the vertical signal line is appropriately biased.

Figure 7:
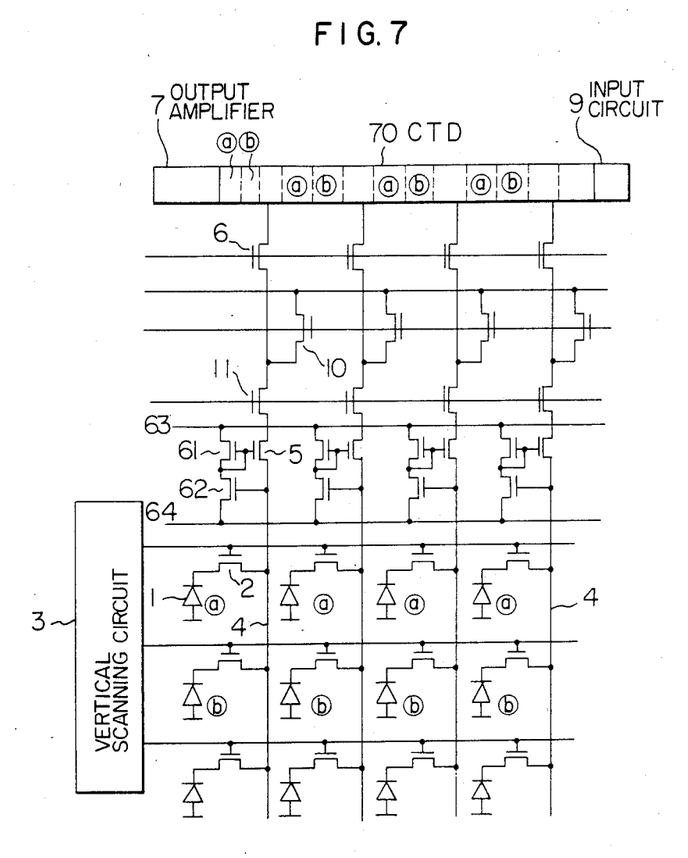
Figure 8:
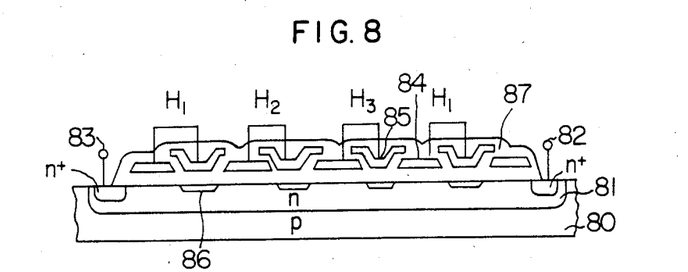
FIG. 8 shows a sectional view of a three-phase BCD.

FIG. 7 shows another embodiment of the present invention. Numeral 70 denotes a 3-phase buried charge transfer device BCD as shown in FIG. 8 (Japanese Pat. No. 928711). Signals on lines ⓐ and ⓑ are transferred to and stored in two of the three phases of the three-phase BCD 70. Thus, in spite of the single BCD, signals from two picture cells can be simultaneously read out and a high resolution is attained.

Figure 9:
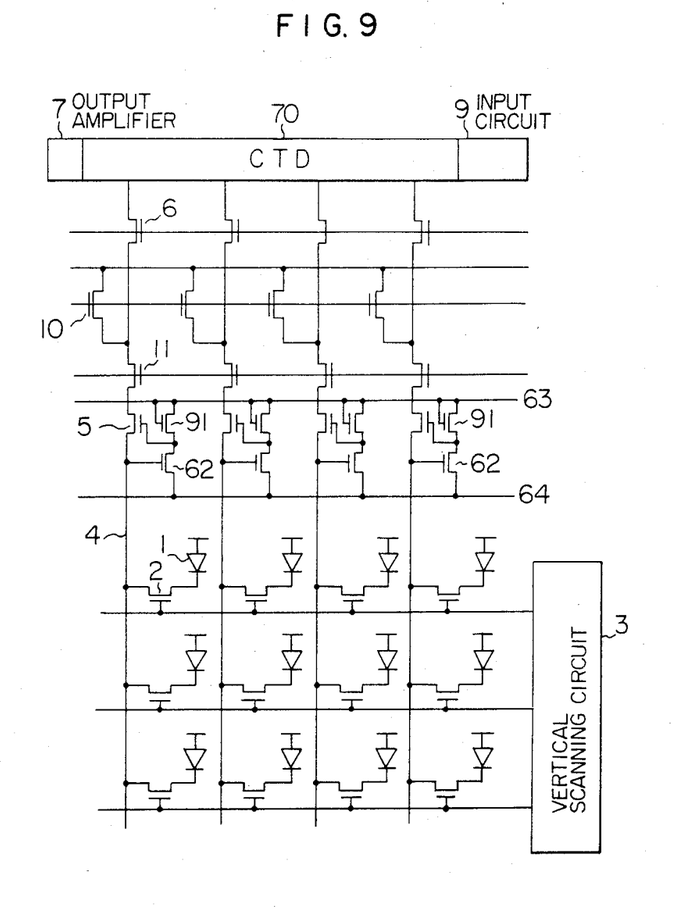

In an embodiment shown in FIG. 9, the depletion type transistor 61 of the embodiment of FIG. 7 is substituted by an enhancement type transistor 91. It sufficiently attains the advantage of the present invention.

Figure 10:
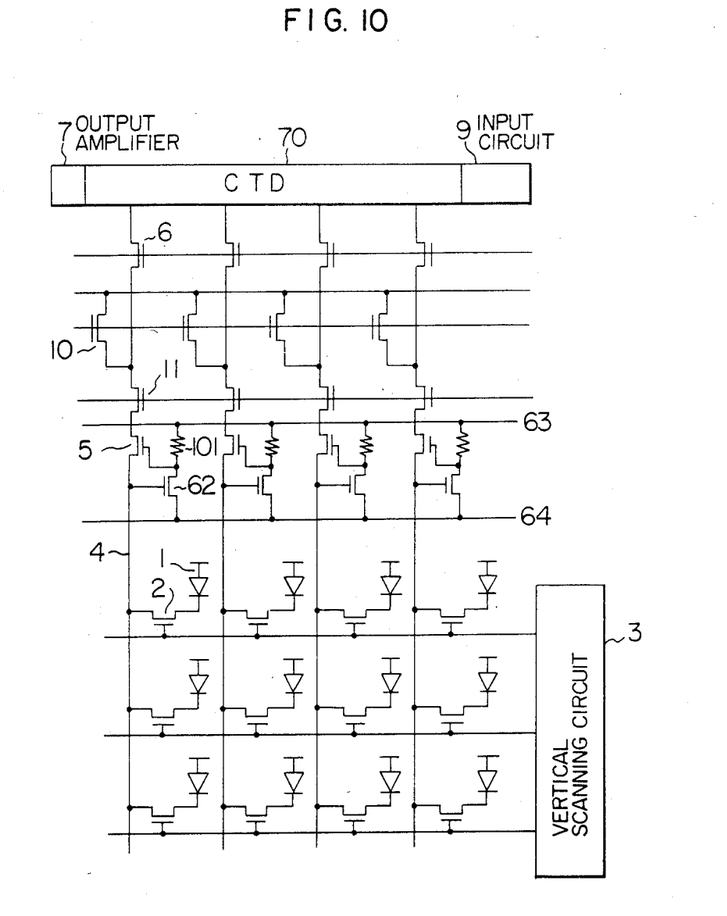

In FIG. 10, poly-Si and/or diffusion layer resistors 101 are used as the load of the inverter.

In the embodiments of FIGS. 5 to 10, the bias charges for reading out the signals are supplied from the BCD 8 or 70. In an embodiment shown in FIG. 11, charges stored in capacitors 110 are used as the bias charges.

Figure 11:
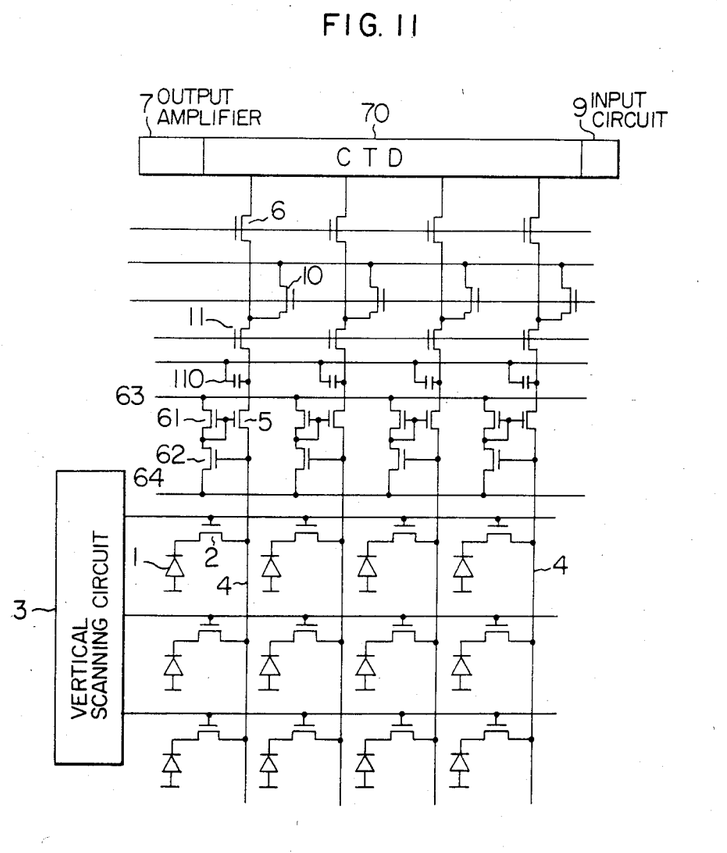
Figure 12:
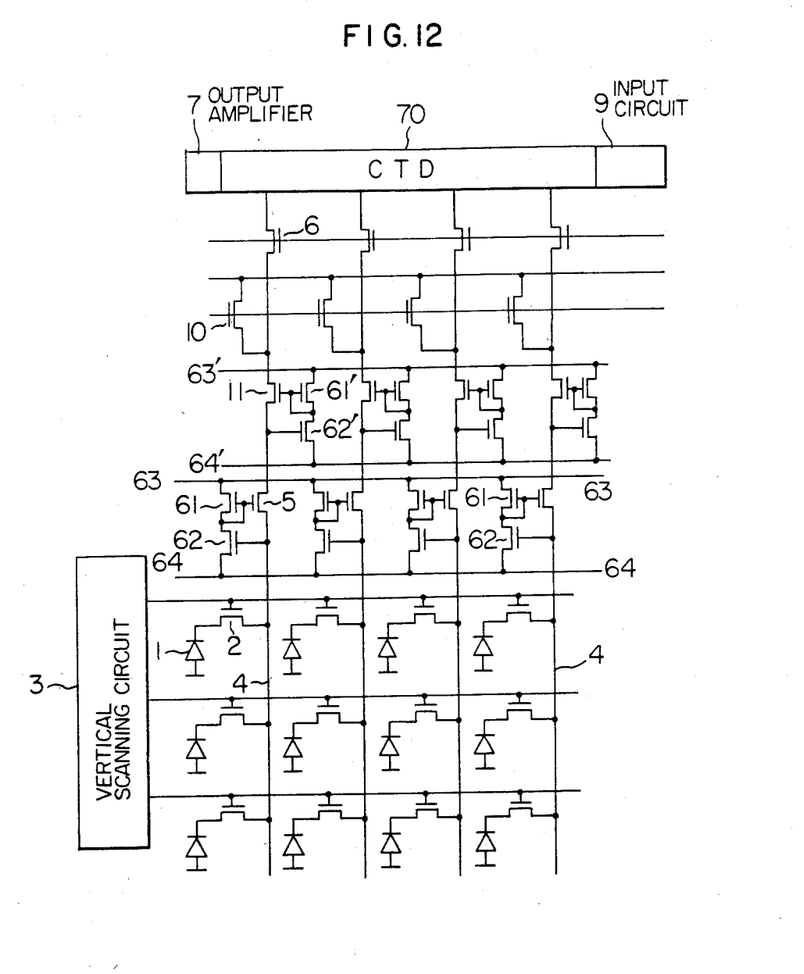

In the embodiment of FIG. 11, a transfer efficiency from the drain 12 to the BCD 8 through the transistors 11 and 6 is an important factor to the charge transfer efficiency. In an embodiment of FIG. 12, inverter circuits (each comprising 61' and 62') are connected to the gates of the transistors 11 so that the transfer efficiency is further improved.

In accordance with the present invention, the transfer efficiency is increased by inserting the inverter circuits between the transfer transistors and the vertical signal lines, and the fixed pattern noise is substantially reduced by supplying the bias charges. The random noise is also reduced and a high sensitivity imaging device is provided.

We claim:

1. A high sensitivity solid-state imaging device wherein a photo-sensing section is constructed of a MOS-type sensor in which picture elements each comprised of a photodiode and a switching MOS transistor are arrayed in the form of a matrix, wherein signal outputs of the respective picture elements of said MOS-type sensor are transferred to a CTD (charge transfer device) through vertical signal lines, and wherein the signal outputs are read out by said CTD, said imaging device comprising:

signal-transfer means for causing bias charges to enter into said vertical signal lines so as to mix them with signal charges on said vertical signal lines and for causing the mixed signal charges to be transferred into said CTD, said signal-transfer means including a first gate MOS transistor which is connected between the vertical signal line and said CTD;

reset means for setting a potential of said vertical signal line to a predetermined reference voltage before the bias charges enter into said vertical signal line, said reset means including second and third gate MOS transistors which are connected in series between said first gate MOS transistor and said vertical signal line;

a reset gate element which is connected between a juncture of said first and second gate MOS transistors and a reset-voltage line; and an inverter circuit having a first input terminal thereof connected to a corresponding one of said vertical signal lines, a second input terminal connected to a common voltage line, and an output terminal connected to the gate of the corresponding third gate MOS transistor.

2. A high sensitivity solid-state imaging device according to claim 1, wherein the gain of said inverter circuit is above 6.

3. A high sensitivity solid-state imaging device according to claim 1, wherein said inverter circuit includes a depletion type MOS transistor as a load and a driver MOS transistor, the source and gate of said depletion type MOS transistor and the drain of said driver MOS transistor each being connected to the gate of the corresponding third gate MOS transistor, and the gate and source of said driver MOS transistor being connected to the corresponding one of said vertical signal lines and said common voltage line, respectively.

4. A high sensitivity solid-state imaging device according to claim 1, wherein said inverter circuit includes an enhancement type transistor as a load and a driver MOS transistor, the source of said enhancement type transistor and the drain of said driver MOS transistor each being connected to the gate of the corresponding third gate MOS transistor, the gate and drain of said enhancement type transistor being connected to each other, and the gate and source of said driver MOS transistor being connected to the corresponding one of said vertical signal lines and said common voltage line, respectively.

5. A high sensitivity solid-state imaging device according to claim 1, wherein said inverter circuit includes a poly-Si and/or diffusion layer resistor as a load and a driver MOS transistor, the gate of said driver MOS transistor being connected to said resistor and the gate of the corresponding third gate MOS transistor, respectively, and the gate and source of said driver MOS transistor being connected to the corresponding one of said vertical signal line and said common voltage line, respectively.

6. A high sensitivity solid-state imaging device according to claim 1, further comprising a capacitor connected between said second and third gate MOS transistors storing charges being used as said bias charges.

7. A high sensitivity solid-state imaging device according to claim 1, further comprising another inverter circuit, the output terminal of which is connected to the gate of the corresponding second gate MOS transistor.

8. A high sensitivity solid-state imaging device according to claim 1, wherein at least two CTDs are coupled to said each vertical signal line to construct first and second read-out channels by means of the first and second CTDs, and means is comprised for transferring the signal outputs to the first channel in a first half of a horizontal blanking period and for transferring the signal outputs to the second channel in a latter half of the horizontal blanking period.

* * * * *